(12) United States Patent
Park et al.

(10) Patent No.: US 9,340,673 B1
(45) Date of Patent: *May 17, 2016

(54) BLUE DYE COMPOUND, BLUE RESIN COMPOSITION FOR COLOR FILTER CONTAINING SAME AND COLOR FILTERING USING SAME

(71) Applicant: KYUNG-IN SYNTHETIC CO., LTD, Incheon (KR)

(72) Inventors: Soonhyun Park, Gyeonggi-do (KR); Jung Rok Kim, Gyeonggi-do (KR); Jeong Gi Kim, Gyeonggi-do (KR); Hyun Jae Chun, Seoul (KR); Do Kyung Lee, Incheon (KR); Min-Jung Lee, Seoul (KR); Youn A Lee, Seoul (KR)

(73) Assignee: KYUNG-IN SYNTHETIC CO., LTD., Incheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/895,082

(22) PCT Filed: Jun. 2, 2014

(86) PCT No.: PCT/KR2014/004884
§ 371 (c)(1),
(2) Date: Dec. 1, 2015

(87) PCT Pub. No.: WO2014/196770
PCT Pub. Date: Dec. 11, 2014

(30) Foreign Application Priority Data

Jun. 3, 2013 (KR) .................. 10-2013-0063399

(51) Int. Cl.
*G02B 5/23* (2006.01)
*C09B 11/12* (2006.01)
*G03F 7/00* (2006.01)
*G02B 5/22* (2006.01)
*G02F 1/1335* (2006.01)
*G03F 1/00* (2012.01)
*C08F 10/00* (2006.01)
*C08F 132/08* (2006.01)
*C08F 136/00* (2006.01)
*C08F 232/08* (2006.01)
*C08F 236/00* (2006.01)
*C08F 32/08* (2006.01)
*C08F 36/00* (2006.01)

(52) U.S. Cl.
CPC ............... *C09B 11/12* (2013.01); *G02B 5/223* (2013.01); *G03F 7/0007* (2013.01)

(58) Field of Classification Search
USPC ........... 252/586; 349/106; 359/891; 427/514; 430/7, 270.1; 526/280
See application file for complete search history.

(56) References Cited

FOREIGN PATENT DOCUMENTS

| KR | 1020120012393 | 2/2012 |
|----|---------------|--------|
| KR | 1020120083938 | 7/2012 |
| KR | 1020120098451 | 9/2012 |
| WO | 1020120028815 | 3/2012 |
| WO | 2012165537    | 12/2012 |

*Primary Examiner* — Bijan Ahvazi
(74) *Attorney, Agent, or Firm* — Duane Morris LLP; J. Rodman Steele, Jr.; Gregory M. Lefkowitz

(57) ABSTRACT

Disclosed is a blue dye compound for a color filter represented by Chemical Formula 1. The blue colored resin composition including the blue dye compound has excellent solubility to an organic solvent, such as propylene glycol methyl ether acetate (PGMEA), excellent miscibility with the other dyes or pigments and high heat resistance. Therefore, when using the blue dye compound, it is possible to obtain a color filter having high luminance and contrast.

11 Claims, No Drawings

BLUE DYE COMPOUND, BLUE RESIN COMPOSITION FOR COLOR FILTER CONTAINING SAME AND COLOR FILTERING USING SAME

CROSS-REFERENCE TO RELATED APPLICATIONS

This application is a §371 national stage entry of International Application No. PCT/KR2014/004884, filed Jun. 2, 2014, which claims priority to South Korean Patent Application No. 10-2013-0063399 filed Jun. 3, 2013, the entire contents of which are incorporated herein by reference.

TECHNICAL FIELD

The present disclosure relates to a blue dye compound for a color filter. More particularly, the present disclosure relates to a novel triarylmethane dye compound having improved solubility and higher heat resistance as compared to the conventional dyes, a blue colored resin composition for a color filter including the same, and a color filter using the same.

BACKGROUND ART

A liquid crystal display uses optical and electrical properties of a liquid crystal material to display images. Such a liquid crystal display has some advantages, including light weight, low power consumption and low driving voltage, as compared to cathode ray tubes (CRT), plasma display panels, or the like. A liquid crystal display includes a liquid crystal layer disposed between one glass substrate and another glass substrate. The light emitted from a light source passes through the liquid crystal layer, which controls the transmission of light. The light that has passed through the liquid crystal passes through a color filter layer, and the light that has passed through the color filter layer is used to realize a full-color screen by an additive mixture of colors.

In general, as methods for producing a color filter for use in a liquid crystal display, there are known a dyeing method, printing method, electrodeposition method and a pigment dispersion method. Although methods using a dye have been discussed to date, use of a dye causes problems of lower heat resistance, photoresistance and chemical resistance as compared to a pigment, and thus shows limited applicability. In addition, in the case of a dyeing method, a complicated process is required, resulting in poor cost efficiency. Therefore, recently, a pigment dispersion method has been used generally. Although a pigment has lower transparency than a dye, such a disadvantage has been overcome by advanced technology of micronization and dispersion of a pigment. Since a color filter obtained by a pigment dispersion method uses a pigment, it is stable against light, heat, solvent, or the like. When such a color filter is subjected to patterning through photolithography, it is easy to produce a color filter for use in a large-screen and high-precision color display. Thus, such a color filter is now used most widely.

A pigment used for a pigment dispersion type color resist includes each of a red, green and a blue pigments, when forming an RGB color filter. In general, the pigment may further include a yellow pigment, purple pigment, or the like in order to represent colors more effectively. A method for producing a color filter by pigment dispersion includes applying a color resist solution onto a substrate by using a spin coater, followed by drying to form a coating film. Then, the coating film is subjected to pattern exposure and development to obtain colored pixels, and heat treatment is carried out at high temperature to obtain a first color pattern. This process is repeated according to the number of colors, thereby providing a color filter. The most important factor determining the quality of a color resist is the properties of a pigment used as a colorant, dispersibility thereof and dispersion state thereof. Recently, as LCDs have been produced to have a large scale and high precision, requirements for a color filter, such as high transmission of a colored layer, high contrast, reduced width of a black matrix and high reliability, have been increased every year. As a means for satisfying such requirements, a pigment is micronized to the highest degree in order to meet color properties, such as luminance and contrast, according to the related art.

However, the pigment powder obtained from its synthesis cannot be used as it is, because preparation of a pigment dispersion requires a stable dispersion state and easy micronization. Thus, a micronization process, such as salt milling, is required, but such a post-treatment process is not preferred in terms of environmental protection. Moreover, a number of additives, such as a dispersing agent and pigment derivative, are required, and a very complicated and cumbersome process is required to obtain a pigment dispersion. In addition, such a pigment dispersion requires complicated storage and transport conditions to maintain its optimal quality state.

In the case of a pigment dispersion, the pigment is present as particles and thus causes light scattering. In addition, micronization of a pigment causes a rapid increase in surface area of pigment, degradation of dispersion stability and generation of non-uniform pigment particles. For these reasons, it is difficult to produce a color resist.

In addition, many studies have been conducted recently to accomplish high luminance, high contrast and high resolution by using a pigment. However, the above-mentioned problems related with pigment micronization and dispersion stability lead to insufficient improvement of physical properties of a color filter using a pigment as a colorant.

As a substitute for a pigment dispersion, some studies have been conducted to improve luminance and contrast by using a hybrid type colorant containing a pigment in combination with a dye to improve physical properties. Although such studies lead to slight improvement of luminance and contrast, they are merely adding some dyes to a pigment. Thus, it is not possible to improve physical properties significantly.

To solve the above-mentioned problems and to accomplish high luminance, high contrast and high resolution, some studies have been conducted more recently about using a dye instead of a pigment as a colorant. Particularly, many attempts have been made to use a triarylmethane dye as a blue colorant. In general, a triarylmethane dye has high transmission to 420-450 nm of a color filter, and thus shows excellent color characteristics as a blue colorant for a color filter. However, such a triarylmethane dye has low solubility to a solvent used for a colored composition for a color filter and shows poor heat resistance. In general, as a solvent for a colored composition for a color filter, propylene glycol monomethyl ether acetate (PGMEA), propylene glycol monomethyl ether (PGME) or cyclohexanone is used widely. In the case of a currently known dye, it is easy to ensure the solubility to cyclohexanone. However, such a dye has low solubility to PGMEA and PGME. Particularly, there is a tendency to prohibit use of cyclohexanone since it is an environmentally harmful material. Thus, there is a need for a dye having high solubility to PGMEA of PGME.

As one example of some studies about triarylmethane dyes according to the related art, there have been disclosed a salt compound having a cation of triarylmethane dye with an anion of naphthalenesulfonate or naphtylaminesulfonate that shows improved solubility and heat resistance, a colored resin composition including the same, and a color filter using the same. However, such a compound has low solubility to propylene glycol monomethyl ether acetate (PGMEA) and shows poor heat resistance.

As another example, there has been conducted a study about a compound of a triarylmethane cation with an anion of another dye. Although such a compound provides partially improved heat resistance, it still has low solubility to an organic ester solvent, such as PGMEA.

DISCLOSURE

Technical Problem

A technical problem to be solved by the present disclosure is to provide a blue dye compound, which solves the above-mentioned problems of a triarylmethane dye that is a blue colorant having good color characteristics but showing low solubility to propylene glycol monomethyl ether acetate (PGMEA), and thus has excellent solubility and heat resistance.

Another technical problem to be solved by the present disclosure is to provide a blue colored resin composition for a color filter including the blue dye compound, and a color filter using the same.

Technical Solution

In one general aspect, there is provided a triarylmethane blue dye compound represented by the following Chemical Formula 1.

[Chemical Formula 1]

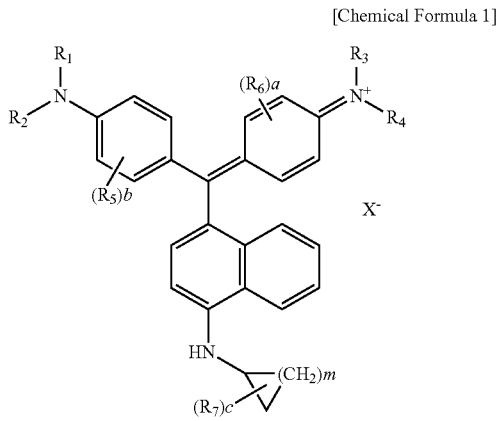

In Chemical Formula 1, X⁻ is a trifluoromethanesulfonate or bistrifluoromethanesulfonimide anion; and $R_1$-$R_7$ are the same or different, and each independently represents any one selected from H, a substituted or non-substituted $C_1$-$C_{10}$ alkyl group, and a substituted or non-substituted $C_6$-$C_{10}$ aromatic hydrocarbon, wherein each of $R_1$, $R_2$, $R_3$, $R_4$ and $R_7$ may independently represent $R_8$ represented by the following Structural Formula 1, with the proviso that at least one of $R_1$, $R_2$, $R_3$, $R_4$ and $R_7$ is $R_8$ represented by the following Structural Formula 1.

[Structural Formula 1]

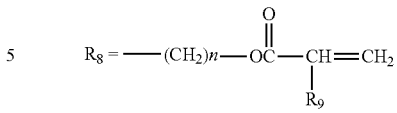

In Structural Formula 1, n is an integer of 1-10, and $R_9$ is H or methyl.

In addition, $R_1$ and $R_2$, and $R_3$ and $R_4$ may be linked to each other to form a saturated or unsaturated ring.

In Chemical Formula 1, each of a, b and c independently represents an integer of 0-4, and m is an integer of 1-10.

According to an embodiment, each of $R_5$ and $R_6$ may independently represent a substituted or non-substituted $C_1$-$C_{10}$ alkoxy group or halogen.

In another aspect, there is provided a blue colored resin composition for a color filter, including a blue dye compound, binder resin, reactive unsaturated compound, polymerization initiator, organic solvent and additives, wherein the blue dye compound is the triarylmethane blue dye compound represented by the above Chemical Formula 1.

Optionally, the blue dye compound may further include at least one selected from a xanthene dye, cyanine dye and azaporphyrin dye, in addition to the triarylmethane blue dye compound represented by the above Chemical Formula 1.

According to an embodiment, the blue dye compound may be present in an amount of 0.01 wt %-50 wt % based on the total weight of the blue colored resin composition.

According to another embodiment, the blue colored resin composition for a color filter may further include a blue pigment, if necessary, wherein the blue pigment may be a copper phthalocyanine-based blue pigment.

According to still another embodiment, the binder resin is not particularly limited as long as it shows binding force, and particular examples thereof may include known film-forming resins.

According to still another embodiment, the reactive unsaturated compound may be selected from the group consisting of a thermosetting monomer or oligomer, photocurable monomer or oligomer and a combination thereof.

According to yet another embodiment, the polymerization initiator may be selected from the group consisting of a thermal curing initiator, photocuring initiator and a combination thereof.

In still another aspect, there is provided a color filter obtained by using the blue colored resin composition for a color filter.

Advantageous Effects

The triarylmethane blue dye compound according to the present disclosure has excellent solubility to propylene glycol monomethyl ether acetate (PGMEA) and high heat resistance. Therefore, when using the triarylmethane blue dye compound according to the present disclosure, it is possible to obtain a color filter having higher luminance and contrast as compared to the color filters using the conventional pigments.

BEST MODE

Exemplary embodiments now will be described more fully hereinafter.

Recently, as a colorant for a color filter, a dye having higher luminance than a pigment has been developed. However, in general, a dye has significantly lower heat resistance than a pigment and generally shows lower solubility to an organic solvent used for a color filter. Thus, it is difficult for a dye to satisfy the requirements as a colorant for a color filter, including high solubility to an organic solvent, high heat resistance and high luminance at the same time. In addition, dyes having satisfying reliability are rare.

The blue dye compound according to the present disclosure provides improved solubility and heat resistance of triarylmethane having excellent color characteristics as a blue colorant for a color filter, and is suitable for application to a blue colored composition for a color filter.

The blue dye compound according to the present disclosure is a triarylmethane compound represented by the following Chemical Formula 1.

[Chemical Formula 1]

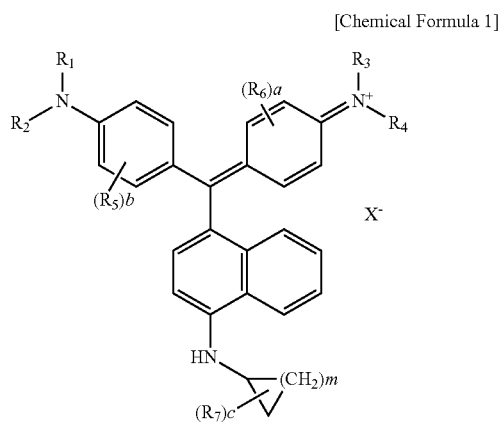

In Chemical Formula 1, X⁻ is a trifluoromethanesulfonate or bistrifluoromethanesulfonimide anion; and $R_1$-$R_7$ are the same or different, and each independently represents any one selected from H, a substituted or non-substituted $C_1$-$C_{10}$ alkyl group, and a substituted or non-substituted $C_6$-$C_{10}$ aromatic hydrocarbon, wherein each of $R_1$, $R_2$, $R_3$, $R_4$ and $R_7$ may independently represent $R_8$ represented by the following Structural Formula 1, with the proviso that at least one of $R_1$, $R_2$, $R_3$, $R_4$ and $R_7$ is $R_8$ represented by the following Structural Formula 1.

[Structural Formula 1]

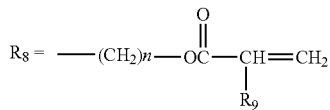

In Structural Formula 1, n is an integer of 1-10, and $R_9$ is H or methyl.

In addition, $R_1$ and $R_2$, and $R_3$ and $R_4$ may be linked to each other to form a saturated or unsaturated ring.

In Chemical Formula 1, each of a, b and c independently represents an integer of 0-4, and m is an integer of 1-10.

According to an embodiment, each of $R_5$ and $R_6$ may independently represent a substituted or non-substituted $C_1$-$C_{10}$ alkoxy group or halogen.

The blue colored resin composition for a color filter according to the present disclosure includes the blue dye compound, a binder resin, reactive unsaturated compound, polymerization initiator, organic solvent and additives, and may further include a blue pigment, if necessary.

Optionally, the blue dye compound may further include at least one dye in addition to the triarylmethane compound represented by the above Chemical Formula 1, and the additional dye may be one generally used for a blue colored resin composition for a color filter, such as a xanthene dye, cyanine dye, azaporphyrin dye, or the like.

The blue dye compound including the compound represented by the above Chemical Formula 1 optionally with at least one additional dye may be used in an amount of 0.01 wt %-50 wt % based on the total weight of the blue colored resin composition. When the blue dye compound is used within the above-defined range, it shows excellent solubility to a solvent and high heat resistance.

The blue pigment may be at least one selected from the blue pigments generally used in the conventional colored resin compositions. Particularly, the blue pigment may include a copper phthalocyanine-based blue pigment. Particular examples of such a phthalocyanine-based blue pigment include the compounds classified into pigments in Color Index (published by The Society of Dyers and Colourists). For example, the blue pigment may include C.I. (Color Index) Pigment Blue 1, 15, 15:1, 15:2, 15:3, 15:4, 15:6, 16, 60, or the like.

The binder resin is not particularly limited as long as it shows binding force. Particularly, known film-forming resins are useful.

For example, useful binder resins include cellulose resins, particularly carboxymethylhydroxyethyl cellulose and hydroxyethyl cellulose, acrylic resins, alkyd resins, melamine resins, epoxy resins, polyvinyl alcohol, polyvinyl pyrrolidone, polyamide, polyamide-imine, polyimide, or the like.

In addition, the binder includes unsaturated resins having a photopolymerizable unsaturated bond, such as acrylic resins. Particularly, useful binder resins include homopolymers and copolymers of polymerizable monomers, such as carboxyl group-containing polymerizable monomers, including methyl methacrylate, ethyl methacrylate, propyl methacrylate, butyl methacrylate, styrene and styrene derivatives, methacrylic acid, itaconic acid, maleic acid, maleic anhydride or monoalkyl maleate, and copolymers of polymerizable monomers, such as methacrylic acid, styrene and styrene derivatives.

For example, reaction products between a compound having each of an oxirane ring and an ethylenically unsaturated compound, such as glycidyl methacrylate, acryloyl glycidyl ether and monoalkylglycidyl itaconate, and a carboxyl-containing polymerizable compound; reaction products between a compound having each of a hydroxyl group and an ethylenically unsaturated compound (unsaturated alcohol) (e.g. allyl alcohol, 2-buten-4-ol, oleyl alcohol, 2-hydroxyethyl methacrylate, N-methylol acrylamide, etc.) and a carboxyl-containing polymerizable compound may be used as binders, and such binders may include an unsaturated compound having no isocyanate group.

The binder generally has an equivalent unsaturation degree (molecular weight of binder per unsaturated compound) of 200-3,000, particularly 230-1,000, in view of adequate photopolymerizability and film hardness. To provide sufficient alkaline developability after the exposure of a film, the binder may have an acid number of 20-300, particularly 40-200. The binder may have an average molecular weight of 1,500-200,000, particularly 10,000-50,000 g/mol.

The reactive unsaturated compound may be selected from the group consisting of thermosetting monomers or oligomers, photocurable monomers or oligomers and a combination thereof. Preferably, the reactive unsaturated monomer may be a photocurable monomer and may include at least one reactive double bond and additional reactive groups in a single molecule.

In this context, particularly useful photocurable monomers include reactive solvents or reactive diluents, such as mono-, di-, tri- and multi-functional acrylates and methacrylates, vinyl ethers, glycidyl ethers, or the like. The additional reactive groups may include aryl, hydroxyl, phosphate, urethane, secondary amine, N-alkoxymethyl group, or the like.

Such types of monomers are known to those skilled in the art and are described, for example, in [Roempp, Lexikon, Lacke und Druckfarben, Dr. Ulrich Zorll, Thimem Verlag Stuttgart-New York, 1998, p. 491/492]. Selection of monomers particularly depends on the type and intensity of irradiation used for the resin composition, target reaction to be carried out by the photoinitiator and film characteristics. Such photocurable monomers may be used alone or in combination.

The polymerization initiator may be a thermosetting initiator, photocuring initiator or a combination thereof. Particularly, the polymerization initiator may be a photocuring initiator, which is a compound forming a reaction intermediate capable of inducing the polymerization of monomers and/or binder or the like, after the absorption of visible rays or ultraviolet rays. For example, the polymerization initiator is described in [Roempp, Lexikon, Lacke und Druckfarben, Dr. Ulrich Zorll, Thimem Verlag Stuttgart-New York, 1998, p. 445/446].

Particular examples of the solvent include ketones, alkylene glycol ethers, alcohols and aromatic compounds. Such ketones include acetone, methyl ethyl ketone, cyclohexaone, or the like. Such alkylene glycol ethers include methyl cellosolve (ethylene glycol monomethyl ether), butyl cellosolve (ethylene glycol monobutyl ether), methylcellosolve acetate, ethylcellosolve acetate, butylcellosolve acetate, ethylene glycol monopropyl ether, ethylene glycol monohexyl ether, ethylene glycol dimethyl ether, diethylene glycol ethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol methyl ether acetate, triethylene glycol ethyl ether acetate, triethylene glycol propyl ether acetate, triethylene glycol isopropyl ether acetate, triethylene glycol, triethylene glycol butyl ether acetate, triethylene glycol t-butyl ether acetate, or the like. Such alcohols include methyl alcohol, ethyl alcohol, isopropyl alcohol, n-butyl alcohol, 3-methyl-3-methoxybutanol, or the like. Such aromatic solvents include benzene, toluene, xylene, N-methyl-2-pyrrolidone, ethyl N-hydroxymethyl pyrrolidone-2-acetate, or the like. Other solvents include 1,2-propanediol diacetate, 3-methyl-e-methyl-3-methoxybutyl acetate, ethyl acetate, tetrahydrofuran, or the like. Such solvents may be used alone or in combination.

The additives may be used with no particular limitation, as long as they conform to their purpose of use. Preferably, to improve the surface texture, fatty acids, fatty amines, alcohols, bean oil, wax, rosin, resins, benzotriazole derivatives, or the like may be used. More preferably, the fatty acids may include stearic acid or behenic acid, and the fatty amines may include stearyl amine.

MODE FOR INVENTION

Hereinafter, the present disclosure will be explained with reference to preferred embodiments in more detail. However, the following examples are for illustrative purposes only and not intended to limit the scope of the present disclosure. It will be understood by those skilled in the art that various changes in form and details may be made thereto without departing from the scope of the present disclosure as defined by the appended claims.

EXAMPLES

1. Preparation of Intermediate Compound (1) Preparation of Compound of Chemical Formula 1

The compound represented by Chemical Formula 1 is prepared according to the following Reaction Scheme 1.

[Reaction Scheme 1]

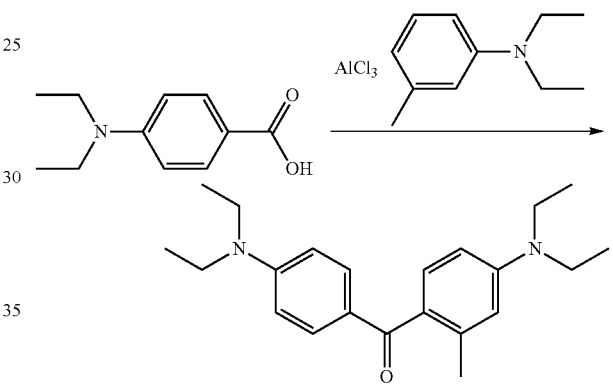

[Chemical Formula 1]

First, 0.249 mol of N,N-diethylaminobenzoic acid is added to 100 g of toluene, followed by agitation. Next, 0.400 mol of thionyl chloride is added dropwise thereto, the resultant mixture is warmed to 80° C., and reaction is carried out for 1 hour. After the reaction, the reaction mixture is subjected to distillation under reduced pressure to remove thionyl chloride and toluene, thereby providing N,N-diethylaminobenzoyl chloride.

Then, 0.310 mmol of anhydrous aluminum chloride is agitated with 120 g of dichloroethane and the resultant mixture is agitated and cooled. N,N-diethylaminobenzoyl chloride obtained as described above is dissolved into 120 g of dichloroethane and the resultant solution is added dropwise to the above mixture while the mixture is maintained at 5° C. or lower, and then the reaction mixture is agitated for 30 minutes. After that, 0.249 mol of N,N-diethylmetatoluidine is added dropwise to the reaction mixture. After the reaction mixture is brought to room temperature, ice water is introduced thereto to quench the reaction. Then, sodium hydroxide solution is introduced to adjust pH of the reaction mixture to 11 or more, and the reaction mixture is filtered through diatomaceous earth to remove insoluble contents. After separating the layers of the reaction mixture, the organic layer is concentrated under reduced pressure. The obtained compound is subjected to column chromatography to obtain 0.075 mol of the compound represented by Chemical Formula 1.

(2) Preparation of Compound of Chemical Formula II

The compound represented by Chemical Formula II is prepared according to the following Reaction Scheme 2.

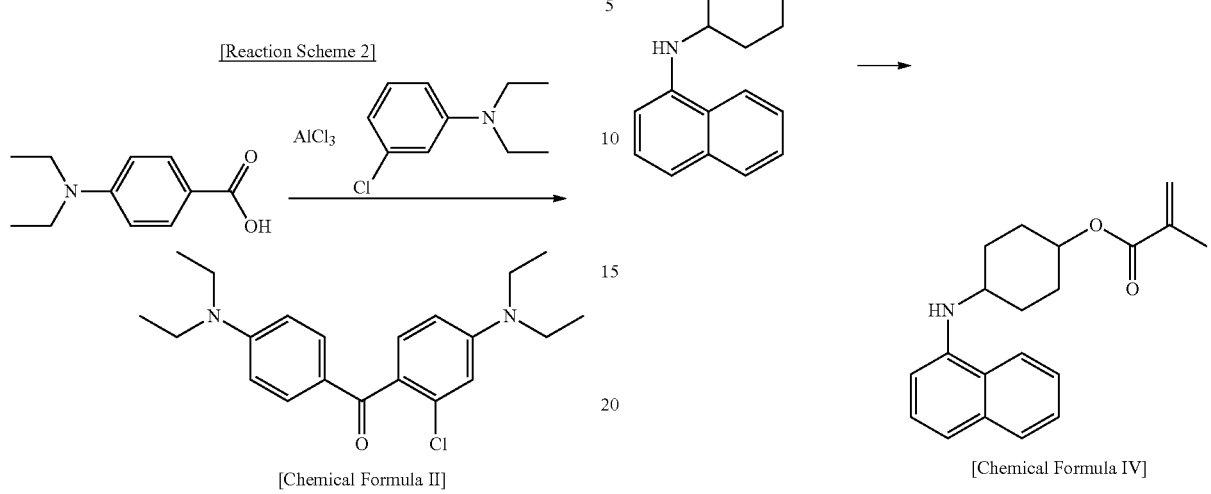

[Chemical Formula II]

The compound represented by Chemical Formula II is obtained in the same manner as the preparation of the compound represented by Chemical Formula 1, except that N,N-diethylmetachloroaniline is used instead of N,N-diethylmetatoluidine. In this manner, 0.068 mol of the compound represented by Chemical Formula II is obtained.

(3) Preparation of Compound of Chemical Formula III

The compound represented by Chemical Formula III is prepared according to the following Reaction Scheme 3.

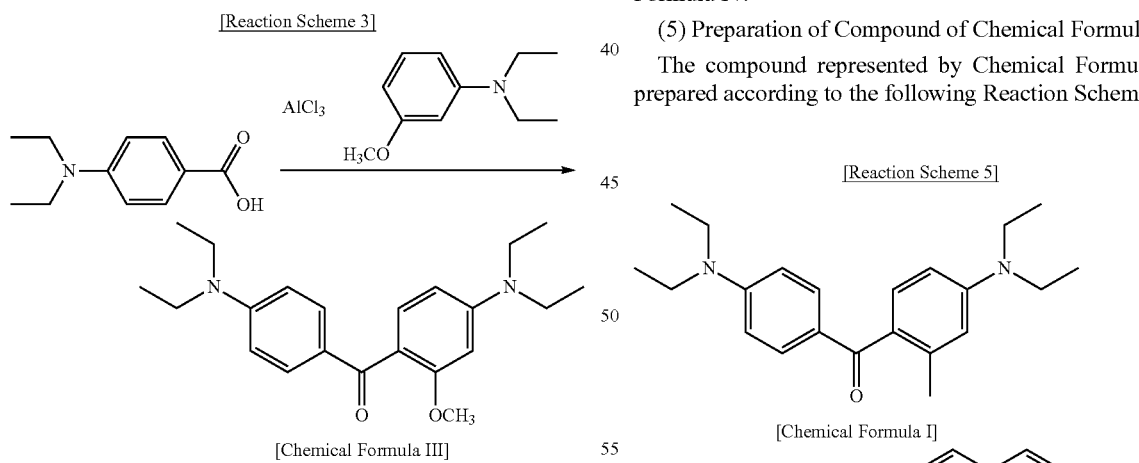

[Chemical Formula III]

The compound represented by Chemical Formula III is obtained in the same manner as the preparation of the compound represented by Chemical Formula 1, except that N,N-diethylmetamethoxyaniline is used instead of N,N-diethylmetatoluidine. In this manner, 0.053 mol of the compound represented by Chemical Formula III is obtained.

(4) Preparation of Compound of Chemical Formula IV

The compound represented by Chemical Formula IV is obtained according to the following Reaction Scheme 4.

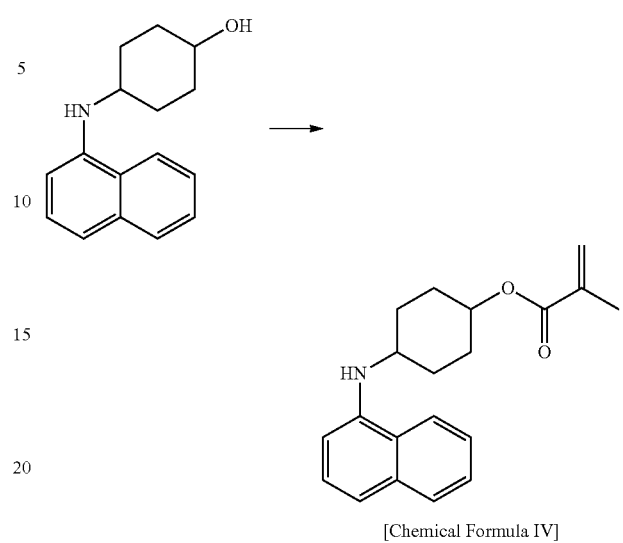

[Chemical Formula IV]

First, 0.220 mol of N-(4-hydroxycyclohexyl)-1-naphthylamine and 0.242 mol of trimethylamine are added to and dissolved in 50 mL of dichloromethane under agitation. Next, 0.242 mol of anhydrous methacrylic acid is added thereto and the mixture is warmed to and maintained at 40° C. After the completion of the reaction, water is added to the reaction mixture to carry out separation of the layers. Then, 20 mL of saturated sodium chloride solution is added and the reaction mixture is agitated, followed by agitation for 30 minutes. After the layers are separated, the organic layer is dried under reduced pressure and the resultant product is purified to obtain 0.190 mol of the compound represented by Chemical Formula IV.

(5) Preparation of Compound of Chemical Formula V

The compound represented by Chemical Formula V is prepared according to the following Reaction Scheme 5.

[Reaction Scheme 5]

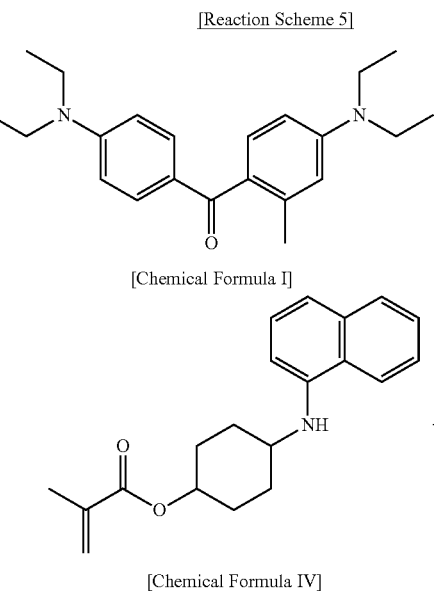

[Chemical Formula I]

[Chemical Formula IV]

11
-continued

[Chemical Formula V]

First, 0.030 mol of the compound represented by Chemical Formula I is added to 140 g of chloroform and the resultant mixture is agitated. Next, 0.045 mol of phosphorus oxychloride is added thereto and the resultant mixture is agitated for 15 minutes. Then, 0.001 mol of 4-methoxyphenol and 0.030 mol of the compound represented by Chemical Formula IV are introduced thereto, and the resultant mixture is warmed, followed by reflux for 4 hours. After the completion of the reaction, the reaction mixture is cooled to room temperature and water is added thereto, followed by agitation. After separating the layers, concentration is carried out under reduced pressure and the resultant compound is purified to obtain 0.025 mol of the compound represented by Chemical Formula V.

(6) Preparation of Compound of Chemical Formula VI

The compound represented by Chemical Formula VI is prepared according to the following Reaction Scheme 6.

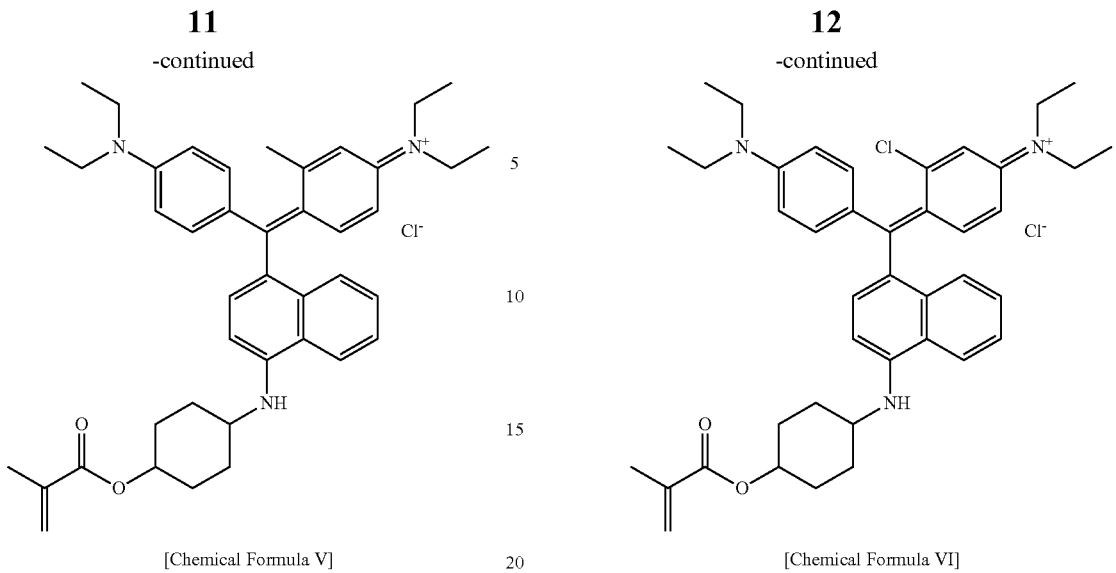

12
-continued

[Chemical Formula VI]

The compound represented by Chemical Formula VI is prepared in the same manner as the preparation of the compound represented by Chemical Formula V, except that the compound represented by Chemical Formula II is used instead of the compound represented by Chemical Formula I. In this manner, 0.023 mol of the compound represented by Chemical Formula VI is obtained.

(7) Preparation of Compound of Chemical Formula VII

The compound represented by Chemical Formula VII is prepared according to the following Reaction Scheme 7.

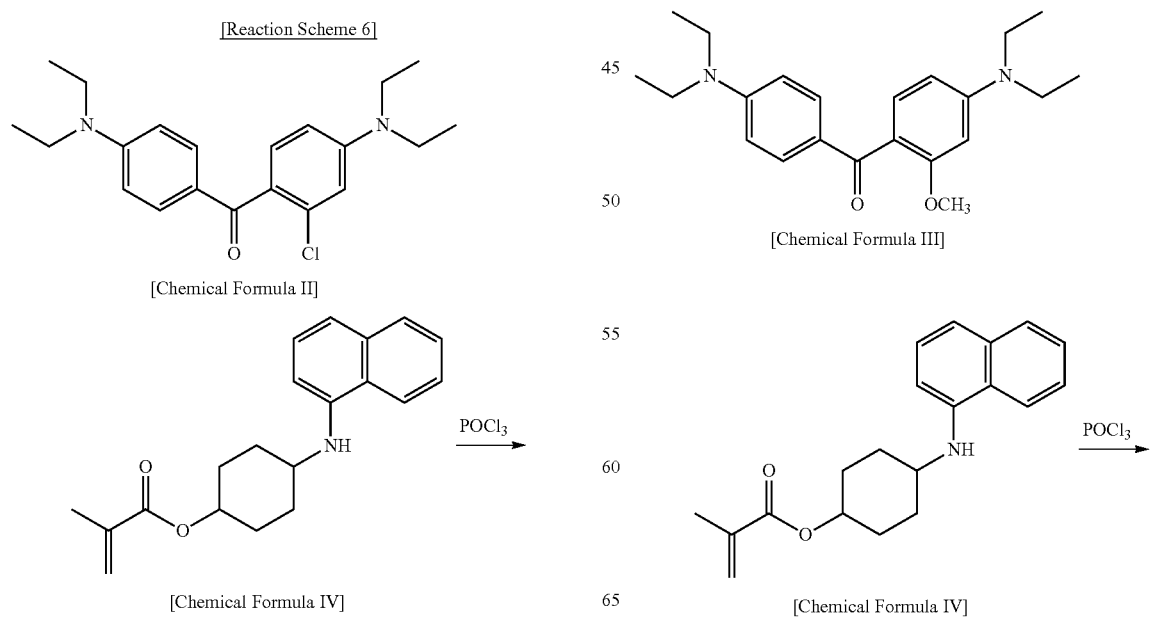

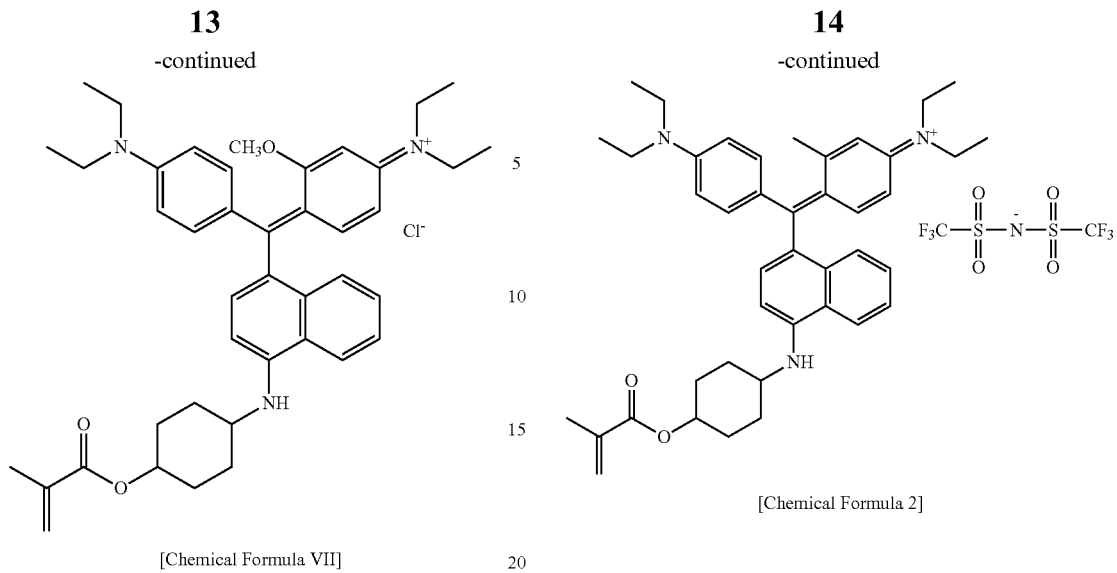

[Chemical Formula VII]

The compound represented by Chemical Formula VII is prepared in the same manner as the preparation of the compound represented by Chemical Formula V, except that the compound represented by Chemical Formula III is used instead of the compound represented by Chemical Formula I. In this manner, 0.022 mol of the compound represented by Chemical Formula VII is obtained.

2. Preparation of Triarylmethane Blue Dye Compound According to the Present Disclosure (1) Preparation Example 1

Preparation of Compound of Chemical Formula 2

The compound represented by Chemical Formula 2 is prepared according to the following Reaction Scheme 8.

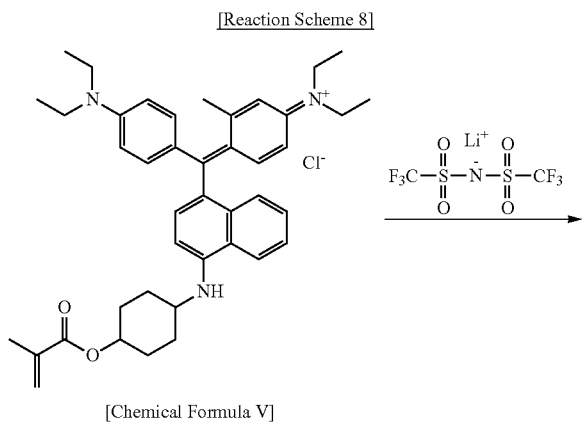

[Reaction Scheme 8]

[Chemical Formula V]

[Chemical Formula 2]

First, 0.010 mol of the compound represented by Chemical Formula V is dissolved into 50 g of MeOH, and 20% aqueous solution of 0.011 mol of lithium bistrifluoromethanesulfonimide is added to carry out substitution of salt. After filtration, the resultant compound is dissolved into chloroform, washed with water and concentrated under reduced pressure to obtain 0.009 mol of the compound represented by Chemical Formula 2.

(2) Preparation Examples 2-6

Preparation of Compounds Represented by Chemical Formula 3-Chemical Formula 7

As shown in the following Table 1, the compounds represented by Chemical Formula V-Chemical Formula VII are subjected to substitution with lithium bistrifluoromethanesulfonimide (A) and sodium trifluoromethanesulfonate (B) in the same manner as Preparation Example 1 to obtain the compounds represented by Chemical Formula3-Chemical Formula 7.

TABLE 1

| Prep. Ex. | Reactant 1 | Reactant 2 | Product |
|---|---|---|---|
| 2 | Chemical Formula VI | (A) | Chemical Formula 3 |
| 3 | Chemical Formula VII | (A) | Chemical Formula 4 |
| 4 | Chemical Formula V | (B) | Chemical Formula 5 |
| 5 | Chemical Formula VI | (B) | Chemical Formula 6 |
| 6 | Chemical Formula VII | (B) | Chemical Formula 7 |

[Chemical Formula 3]
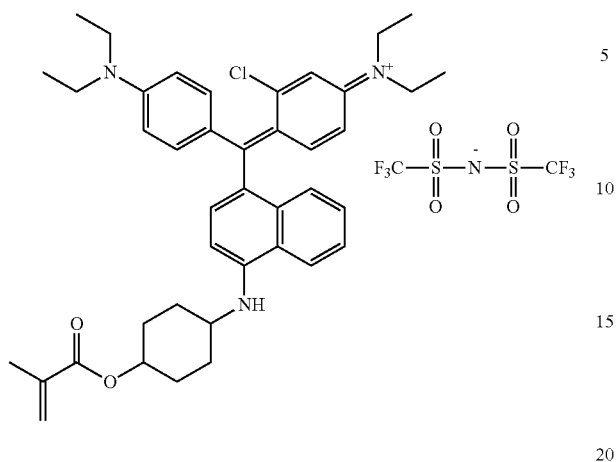
[Chemical Formula 6]
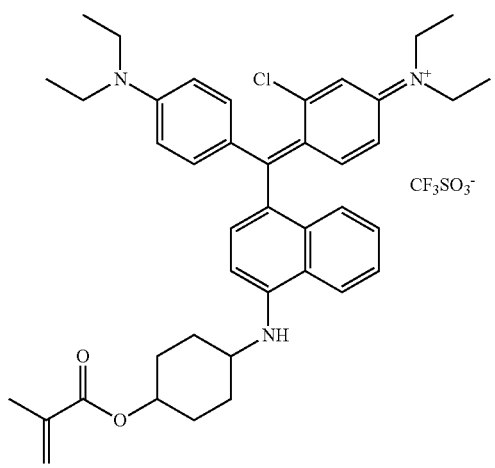
[Chemical Formula 4]
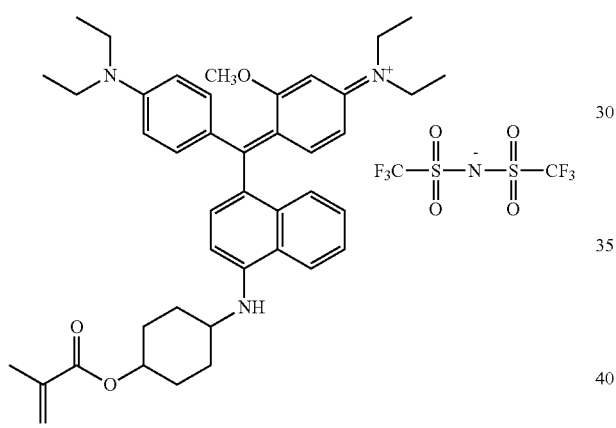
[Chemical Formula 7]
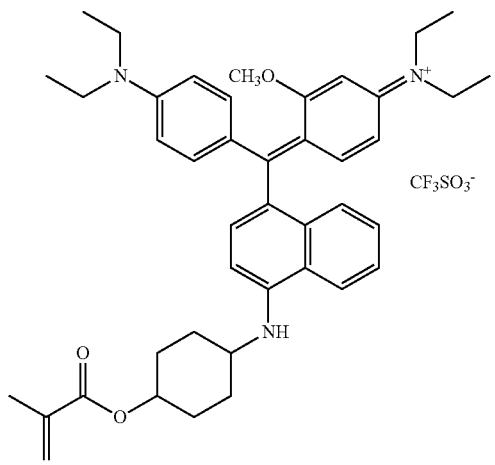
[Chemical Formula 5]
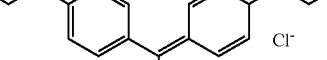
(3) Comparative Example 1
The compound of Comparative Example 1 is prepared according to the following Reaction Scheme 9.
[Reaction Scheme 9]
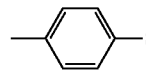

-continued

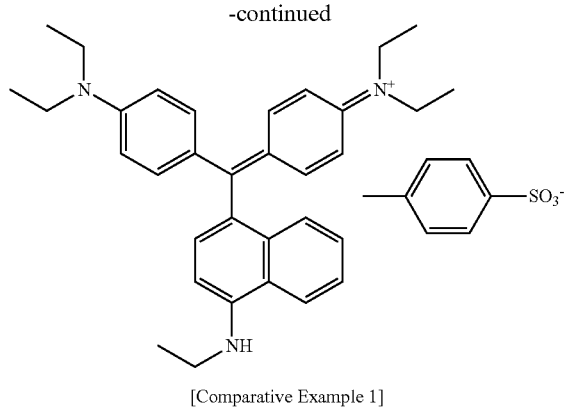

[Comparative Example 1]

First, 0.010 mol of Basic Blue 7 is dissolved into 50 mL of methanol, and 20% aqueous solution of 0.011 mol of sodium p-toluenesulfonate is added thereto to carry out substitution of salt. After filtration, the resultant compound is dissolved into chloroform, washed with water and concentrated under reduced pressure to obtain 0.005 mol of the compound of Comparative Example 1.

3. Test Example 1

Evaluation for Solubility

Each of the dye compounds according to Preparation Examples 1-6, Comparative Example 1 and Comparative Example 2 (Basic Blue 7) is dissolved into propylene glycol monomethyl ether acetate (PGMEA) and the solubility of each compound is determined. The results are shown in the following Table 2.

TABLE 2

| | Preparation Example | | | | | | Comparative Example | |
|---|---|---|---|---|---|---|---|---|
| | 1 | 2 | 3 | 4 | 5 | 6 | 1 | 2 |
| PGMEA | >5% | >5% | >5% | >5% | >5% | >5% | >1% | <1% |

As shown in Table 2, each of the blue dye compounds of Chemical Formula 2-Chemical Formula 7 according to Preparation Examples 1-6 has a high solubility of 5% or more to PGMEA. In the case of Comparative Example 2, it shows a significantly low solubility less than 1% to PGMEA. In addition, in the case of Comparative Example 1 obtained by substitution of Comparative Example 2 with sodium p-toluenesulfonate salt, it shows solubility improved as compared to Comparative Example 2 but the solubility is significantly lower as compared to the compounds according to the present disclosure. As a result, it can be seen that the blue dye compounds according to the present disclosure has excellent solubility to an organic solvent, such as PGMEA.

4. Preparation of Blue Colored Resin Composition for Color Filter and Determination of Heat Resistance Example 1

Preparation of Blue Colored Resin Composition for Color Filter

A photosensitive blue colored resin composition is prepared by using the following composition.

(a) Binder resin: copolymer of benzyl methacrylate/methacrylic acid (mass ratio=60:40) (Mw=20000) 2.7 g
(b) Acrylic monomer: benzyl methacrylate/methacrylic acid (mass ratio=60:40) 10 g
(c) Blue dye compound: Preparation Example 1 2.3 g
(d) Photopolymerization initiator: Irgacure OXE-01 available from BASF 2 g
(e) Solvent: propylene glycol monomethyl ether acetate 83 g Example 2

Preparation of Blue Colored Resin Composition for Color Filter

A photosensitive blue colored resin composition is prepared according to the same composition of Example 1, except that 2.3 g of the compound of Preparation Example 2 is used as a blue dye compound.

Example 3

Preparation of Blue Colored Resin Composition for Color Filter

A photosensitive blue colored resin composition is prepared according to the same composition of Example 1, except that 2.3 g of the compound of Preparation Example 3 is used as a blue dye compound.

Example 4

Preparation of Blue Colored Resin Composition for Color Filter

A photosensitive blue colored resin composition is prepared according to the same composition of Example 1, except that 2.3 g of the compound of Preparation Example 4 is used as a blue dye compound.

Example 5

Preparation of Blue Colored Resin Composition for Color Filter

A photosensitive blue colored resin composition is prepared according to the same composition of Example 1, except that 2.3 g of the compound of Preparation Example 5 is used as a blue dye compound.

Example 6

Preparation of Blue Colored Resin Composition for Color Filter

A photosensitive blue colored resin composition is prepared according to the same composition of Example 1, except that 2.3 g of the compound of Preparation Example 6 is used as a blue dye compound.

Comparative Example 3

A photosensitive blue colored resin composition is prepared according to the same composition of Example 1, except that the compound of Comparative Example 1 is used instead of the compound of Preparation Example 1.

Comparative Example 4

A photosensitive blue colored resin composition is prepared according to the same composition of Example 1, except that 2.3 g of the compound of Basic Blue 7 is used instead of the compound of Preparation Example 1.

Test Example 2

Determination of Heat Resistance

To determine heat resistance, each of the blue colored resin compositions according to the above Examples and Comparative Examples is applied onto a glass substrate having a size of 10 cm×10 cm through spin coating to a thickness of 2 μm. Next, pre-baking is carried out on a hot plate at 90° C. for 3 minutes and cooling is carried out at room temperature for 1 minute. Then, the coated glass substrate is exposed by using an exposure system at an exposure dose of 100 mJ/cm$^2$ (based on 365 nm).

Then, post-baking is carried out in a convection oven at 220° C. for 30 minutes and color characteristics are determined by using a spectrophotometer, MCPD 3700, available from Otsuka electronic Co. After that, further heat treatment is carried out in a convection oven at 220° C. for 1 hour and color characteristics are determined again to obtain ΔEab* values. The results are shown in the following Table 3.

TABLE 3

|  | Examples | | | | | | Comparative Examples | |
| --- | --- | --- | --- | --- | --- | --- | --- | --- |
|  | 1 | 2 | 3 | 4 | 5 | 6 | 3 | 4 |
| Eab* | 2.25 | 2.07 | 2.54 | 2.60 | 2.54 | 2.78 | 17.84 | 31.69 |

It is generally known that a value of ΔEab* of 3 or less satisfies reliability.

It can be seen that Examples 1-6 providing a value of ΔEab* of 3 or less satisfies reliability. In the case of Comparative Examples 3 and 4, they show significantly low heat resistance. Therefore, it can be seen that the blue colored resin composition for a color filter according to the present disclosure has excellent heat resistance.

INDUSTRIAL APPLICABILITY

The triarylmethane blue dye compound according to the present disclosure has excellent solubility to propylene glycol monomethyl ether acetate (PGMEA) and high heat resistance. Therefore, when using the triarylmethane blue dye compound according to the present disclosure, it is possible to produce a color filter having higher luminance and contrast as compared to the color filters using the conventional pigments.

The invention claimed is:

1. A triarylmethane blue dye compound represented by the following Chemical Formula 1:

[Chemical Formula 1]

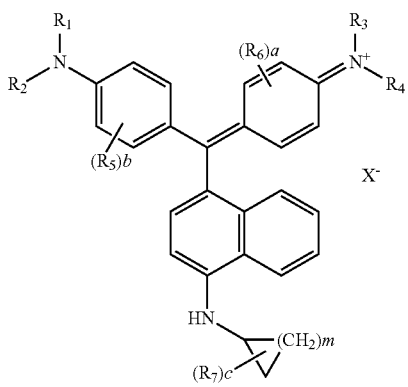

In Chemical Formula 1, X$^-$ is a trifluoromethanesulfonate or bistrifluoromethanesulfonimide anion; and $R_1$-$R_4$ and $R_7$ are the same or different, and each independently represents any one selected from hydrogen, a substituted or non-substituted $C_1$-$C_{10}$ alkyl group, and a substituted or non-substituted $C_6$-$C_{10}$ aromatic hydrocarbon, $R_5$ and $R_6$ are the same or different, and each independently represents any one selected from hydrogen, a substituted or non-substituted $C_1$-$C_{10}$ alkyl group, a substituted or non-substituted $C_6$-$C_{10}$ aromatic hydrocarbon, and a substituted or non-substituted $C_1$-$C_{10}$ alkoxy group or halogen, wherein each pair of $R_1$ and $R_2$, and $R_3$ and $R_4$ is, optionally, linked to each other to form a saturated or unsaturated ring, wherein each of $R_1$, $R_2$, $R_3$, $R_4$ and $R_7$ may independently represent $R_8$ represented by the following Structural Formula 1, with the proviso that at least one of $R_1$, $R_2$, $R_3$, $R_4$ and $R_7$ is $R_8$ represented by the following Structural Formula 1:

[Structural Formula 1]

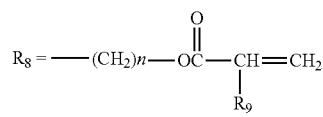

In Structural Formula 1, n is an integer of 1-10, and $R_9$ is hydrogen or methyl, In Chemical Formula 1, each of a, b and c independently represents an integer of 0-4, and m is an integer of 1-10.

2. The triarylmethane blue dye compound according to claim 1, wherein each of $R_5$ and $R_6$ independently represents a substituted or non-substituted $C_1$-$C_{10}$ alkoxy group or halogen.

3. The triarylmethane blue dye compound according to claim 1, wherein $R_1$ and $R_2$, and $R_3$ and $R_4$ are linked to each other to form a saturated or unsaturated ring.

4. The triarylmethane blue dye compound according to claim 1, wherein Chemical Formula 1 is represented by the following Chemical Formula 2 through Chemical Formula 7:

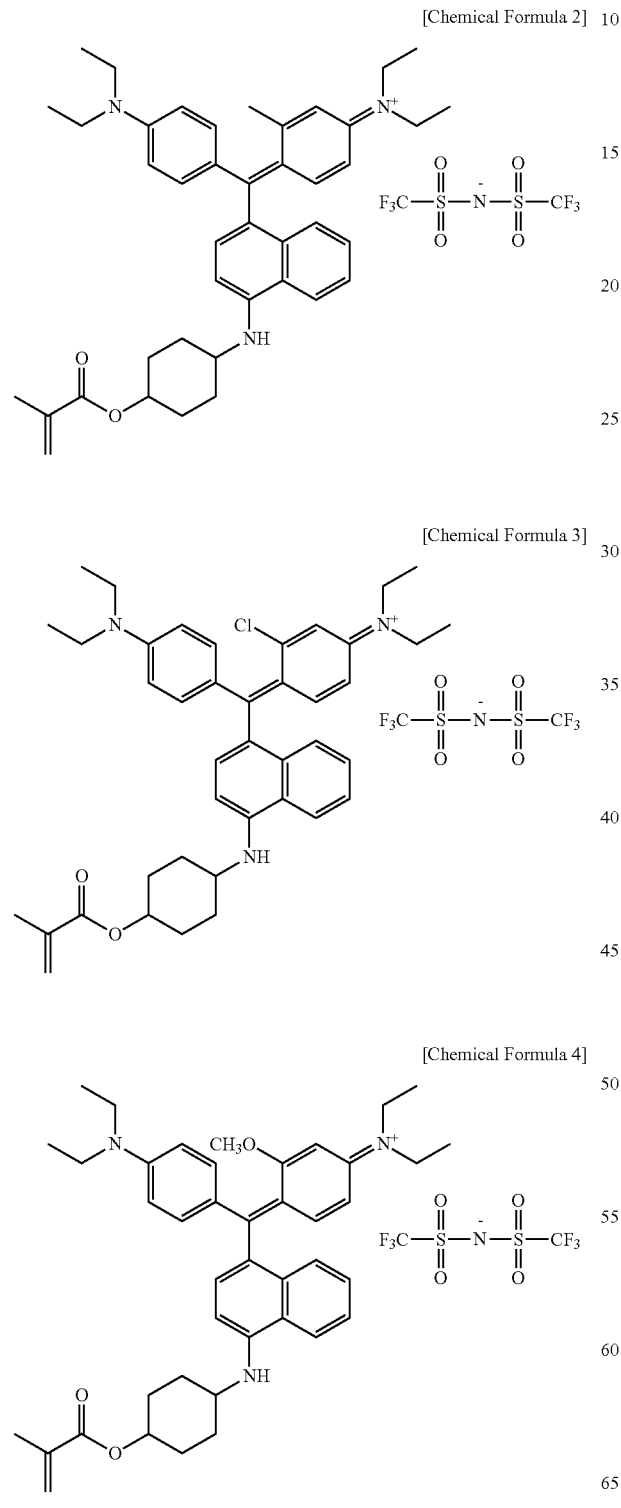

[Chemical Formula 2]

[Chemical Formula 3]

[Chemical Formula 4]

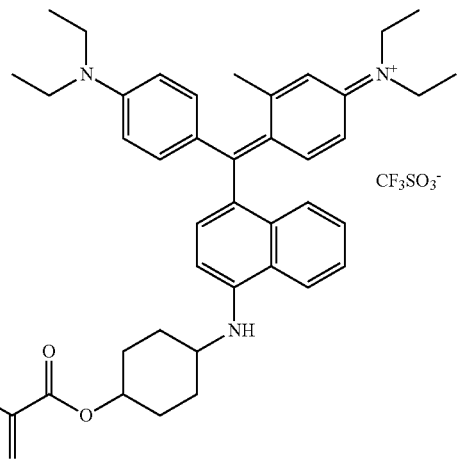

[Chemical Formula 5]

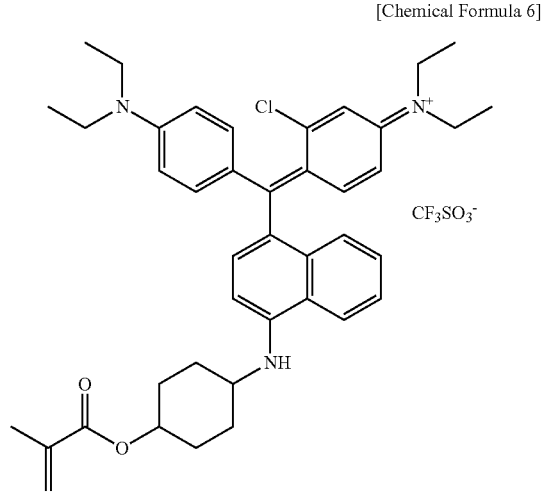

[Chemical Formula 6]

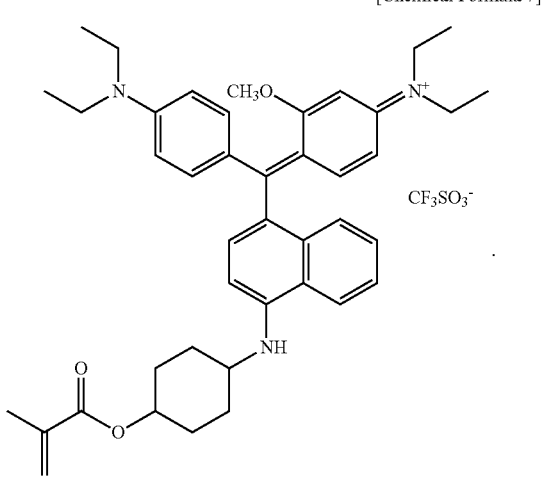

[Chemical Formula 7]

5. A blue colored resin composition for a color filter, comprising:
- a blue dye compound;
- a binder resin;
- a reactive unsaturated compound;
- a polymerization initiator;
- an organic solvent;

and additives, wherein the blue dye compound is the triarylmethane blue dye compound represented by Chemical Formula 1 as defined in claim 1.

6. The blue colored resin composition for a color filter according to claim 5, wherein the blue dye compound further comprises at least one selected from the group consisting of a xanthene dye, cyanine dye and azaporphyrin dye.

7. The blue colored resin composition for a color filter according to claim 5, wherein the blue dye compound is present in an amount of 0.01 wt %-50 wt % based on the total weight of the blue colored resin composition.

8. The blue colored resin composition for a color filter according to claim 5, which may further comprise a blue pigment, wherein the blue pigment is a copper phthalocyanine-based blue pigment.

9. The blue colored resin composition for a color filter according to claim 5, wherein the reactive unsaturated compound is selected from the group consisting of a thermosetting monomer or oligomer, photocurable monomer or oligomer and a combination thereof.

10. The blue colored resin composition for a color filter according to claim 5, wherein the polymerization initiator is selected from the group consisting of a thermal polymerization initiator, photopolymerization initiator and a combination thereof.

11. A color filter obtained by using the blue colored resin composition for a color filter as defined in claim 5.

* * * * *